(12) United States Patent
Brunet et al.

(10) Patent No.: US 10,490,451 B2
(45) Date of Patent: Nov. 26, 2019

(54) PROCESS FOR FABRICATING A TRANSISTOR STRUCTURE INCLUDING A PLUGGING STEP

(71) Applicant: COMMISSARIAT A L'ENERGIE ATOMIQUE ET AUX ENERGIES ALTERNATIVES, Paris (FR)

(72) Inventors: Laurent Brunet, Grenoble (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/625,852

(22) Filed: Jun. 16, 2017

(65) Prior Publication Data
US 2017/0372967 A1   Dec. 28, 2017

(30) Foreign Application Priority Data

Jun. 23, 2016   (FR) ...................................... 16 55842

(51) Int. Cl.
| | |
|---|---|
| *H01L 21/8234* | (2006.01) |
| *H01L 21/56* | (2006.01) |
| *H01L 23/00* | (2006.01) |
| *H01L 21/822* | (2006.01) |
| *H01L 27/06* | (2006.01) |

(52) U.S. Cl.
CPC .......... *H01L 21/8234* (2013.01); *H01L 21/56* (2013.01); *H01L 21/8221* (2013.01); *H01L 24/83* (2013.01); *H01L 27/0688* (2013.01); *H01L 2224/8303* (2013.01); *H01L 2924/1306* (2013.01)

(58) Field of Classification Search
CPC ..... H01L 2924/12042; H01L 21/02076; H01L 2924/00; H01L 2924/0002; H01L 21/31127; H01L 21/6838; H01L 21/68735; H01L 24/27; H01L 24/799; H01L 2924/01006; H01L 2924/01033; H01L 2924/01057
USPC .................................. 257/E21.599; 438/113
See application file for complete search history.

(56) References Cited

U.S. PATENT DOCUMENTS

| | | | | |
|---|---|---|---|---|
| 5,804,259 | A | * | 9/1998 | Robles ..................... B05D 1/60 427/577 |
| 6,875,687 | B1 | * | 4/2005 | Weidman .............. C23C 16/325 257/759 |

(Continued)

FOREIGN PATENT DOCUMENTS

JP        2004-311489 A      11/2004

*Primary Examiner* — Edward Chin
(74) *Attorney, Agent, or Firm* — Baker & Hostetler LLP (57) ABSTRACT

A process for fabricating a transistor structure produced sequentially, comprises at least one string of the following steps: producing at least one first transistor from a first semiconductor layer possibly made of silicon; encapsulating at least the first transistor with at least one first dielectric layer defining a first assembly; bonding a second dielectric layer located on the surface of a second semiconductor layer possibly made of silicon, to the first dielectric layer; depositing a planarizing material layer on the surface of the second semiconductor layer; selectively etching the planarizing material layer, to the second semiconductor layer; and producing at least one second transistor from the second semiconductor layer.

19 Claims, 8 Drawing Sheets

(56) References Cited

U.S. PATENT DOCUMENTS

| | | | |
|---|---|---|---|
| 8,957,458 B2* | 2/2015 | Widjaja | G11C 11/404 |
| | | | 257/204 |
| 9,865,564 B2* | 1/2018 | Cadotte | B08B 7/0042 |
| 2011/0298021 A1 | 12/2011 | Tada et al. | |
| 2014/0252306 A1* | 9/2014 | Du | H01L 23/48 |
| | | | 257/9 |
| 2016/0093591 A1 | 3/2016 | Lan et al. | |
| 2016/0118386 A1* | 4/2016 | Zang | H01L 29/161 |
| | | | 257/369 |
| 2017/0117356 A1* | 4/2017 | Carothers | H01L 23/5226 |

* cited by examiner

PROCESS FOR FABRICATING A TRANSISTOR STRUCTURE INCLUDING A PLUGGING STEP

CROSS-REFERENCE TO RELATED APPLICATION

This application claims priority to foreign French patent application No. FR 1655842, filed on Jun. 23, 2016, the disclosure of which is incorporated by reference in its entirety.

FIELD OF THE INVENTION

The field of the invention is that of transistor structures that are produced sequentially, successively from a first level including at least one first transistor, to which level layers are bonded, from which at least one second transistor is produced so as to form another transistor level. Thus, when a first level is produced from a first substrate, an assembly, used to produce a second level, is bonded to the surface of the first level, and so on level by level.

BACKGROUND

Nevertheless, during the bonding operation, particles may remain at the bonding interface. These particles will tend to be "coated by the bonding" but in the presence of thin layers (<100 nm), typically fully depleted silicon-on-insulator (FDSOI) substrates, the thickness of the semiconductor layer made of silicon Si of which is comprised between 5 and 20 nm and the thickness of the buried oxide layer, commonly denoted the "BOX", of which is comprised between 10 and 200 nm, these particles may lead to breakages (holes) when the structure is thinned. In the worst possible case, for an undeformable particle, a particle of 100 nm may lead to a hole of 1 mm.

These holes are particularly problematic for the sequential production of 3-D transistor structures in which the active zone (semiconductor layer, for example of silicon) of the upper level may be produced by direct bonding an oxidized FDSOI substrate (the thickness of the oxide possibly typically being comprised between 5 nm and 50 nm) on top of a lower transistor level.

Figure 1A:
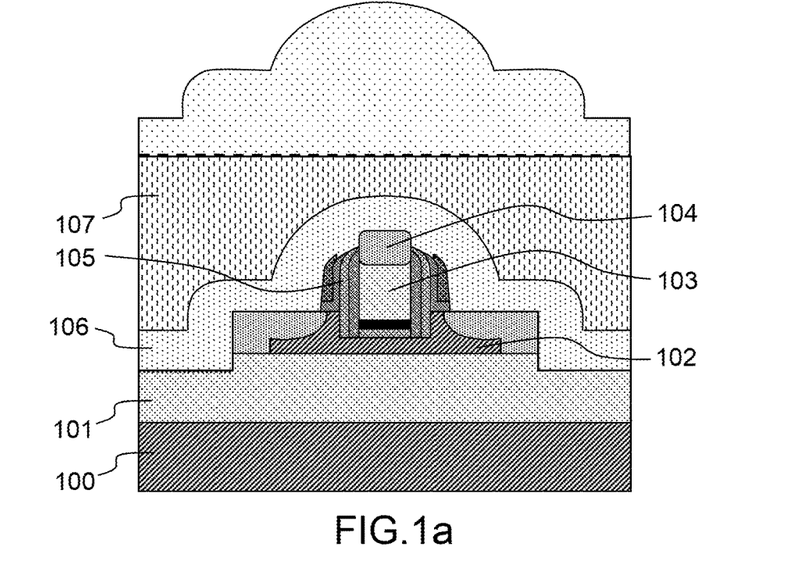
FIGS. 1a, 1b and 1c illustrate steps of a process for manufacturing a sequential 3-D transistor architecture, according to the prior art, and comprising a direct bonding operation.

To this end, FIG. 1a illustrates an example of an FDSOI transistor structure. This type of transistor is produced on a silicon-on-insulator (SOI) substrate corresponding to a structure formed from a stack of a silicon layer (of a few nm to a few tens of nm thickness) on a dielectric layer possibly of silicon dioxide and thus forming a buried BOX dielectric layer. The SOI substrate more precisely includes a bulk silicon substrate 100, the buried BOX layer 101 and a semiconductor layer 102, such as a layer of silicon for example, in which layer a channel, a source region and a drain region are produced. The channel is covered with a gate dielectric 103 that may possibly comprise a plurality of layers, on which dielectric the gate 104 is placed, dielectric spacers 105 also being provided on the flanks of the gate. A dielectric layer 106 covers all of the transistor, it may typically be a question of a nitride layer. All of the structure thus defined is encapsulated with a dielectric 107, possibly typically an oxide.

The structure defined above and encapsulated with an oxide is planarized via a chemical-mechanical polishing (CMP) operation (represented by a dashed line in FIG. 1a). The thickness of this oxide may vary from 30 to 150 nm (zone above the lower transistor), after the CMP processing operation, the thickness possibly typically being 300 to 400 nm before.

Figure 1B:
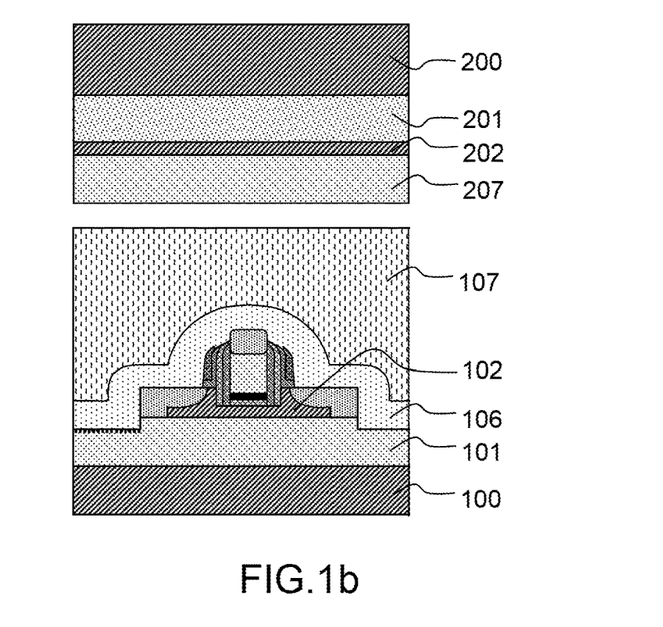

Another SOI substrate (bulk substrate 200, a buried BOX oxide layer 201 and a silicon semiconductor layer 202) oxidized beforehand so as to form an upper layer 207 is then bonded on top of the transistor structure defined beforehand. The two oxides are thus bonded, as illustrated in FIG. 1b, which shows the two assemblies intended to be bonded via the layers 107 and 207.

Figure 1C:
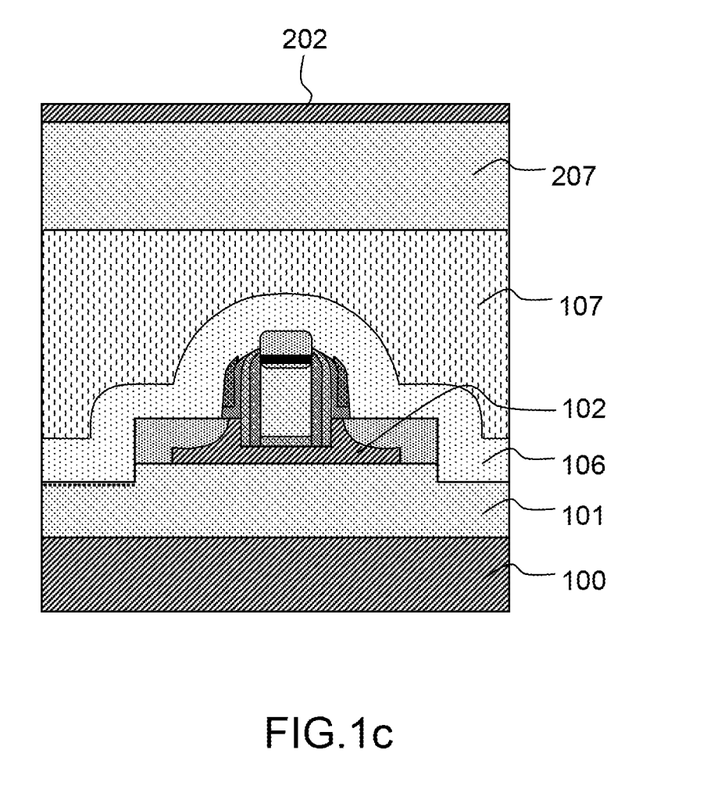

The bonded structure is then thinned: the bulk silicon is mainly removed by a planar grinding process or a milling operation (particular mechanical machining technique), then by chemical etching, typically in tetramethylammonium hydroxide (TMAH). The buried BOX oxide (thermal oxide), the thickness of which may be comprised between 10 nm and 150 nm, is then etched, typically with an HF-based chemistry, leaving uncovered the upper layer 202 of Si, as illustrated in FIG. 1c.

Figure 2A:
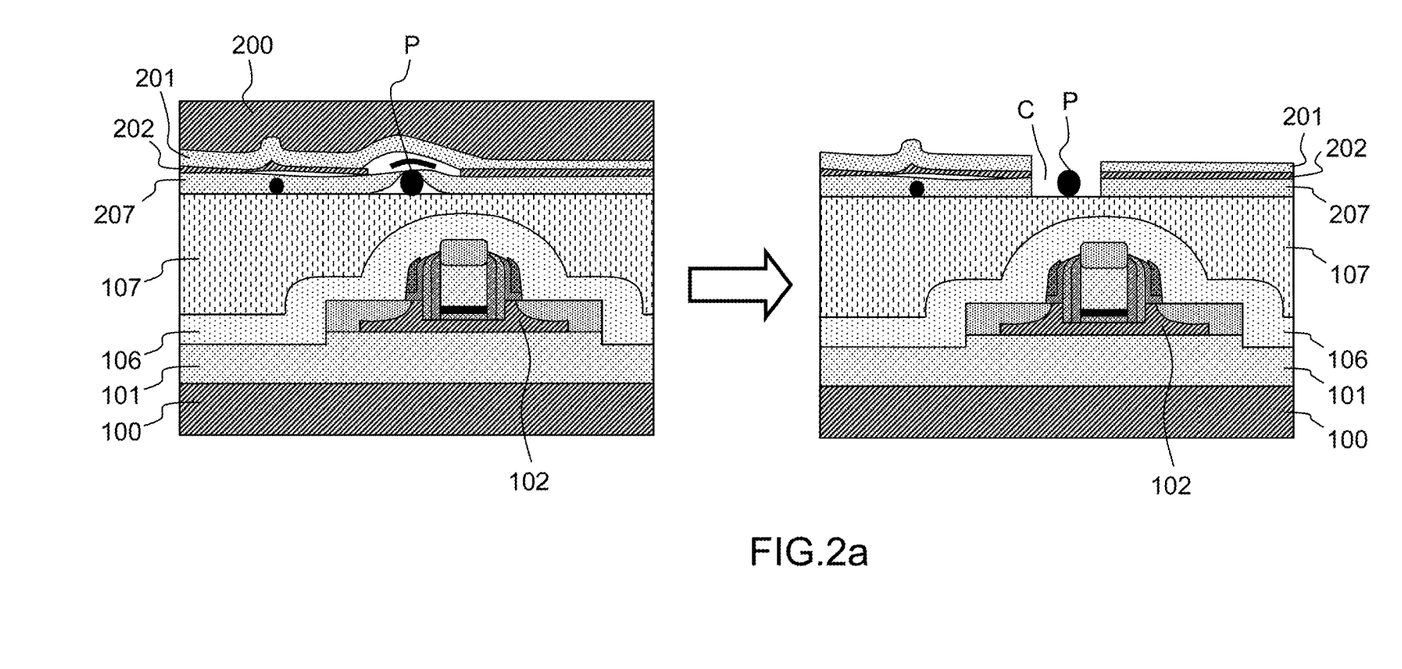
FIGS. 2a and 2b illustrate the impact of a particle at the bonding interface obtained during the sequential 3-D transistor architecture manufacturing process illustrated in FIGS. 1a to 1c.
Figure 2B:
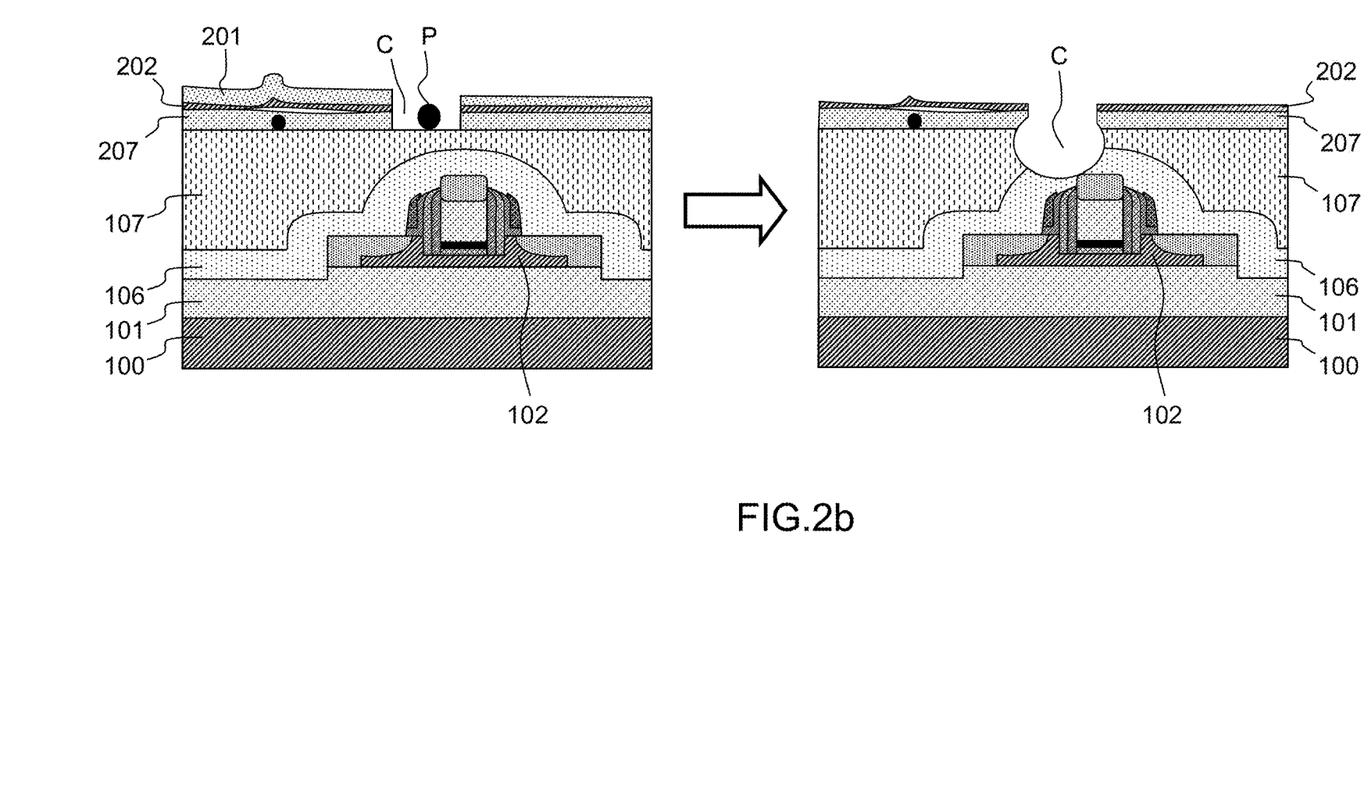

It is important to note that the oxide forming the oxide layer 107 is a deposited oxide and therefore has a much lower resistance to HF than that of a thermal oxide such as the thermal oxide of the oxide layer 207 for example (it will be noted that the oxide layer 207 could also be a deposited oxide layer)—thermal oxide etches at a rate of 6 nm/min in HF diluted to 1%. Deposited oxides are for example consumed two times more rapidly. This point is very important because if a particle is inserted at the bonding interface and breaks the thin layers (207-202-201), the oxide of the lower oxide layer 107 of the lower level is "exposed" during the HF-based chemical etches used to remove the BOX, as illustrated in FIGS. 2a and 2b, which show a particle P trapped in a hole C during the operation of bonding the two assemblies, before and after removal of the bulk portion and before and after removal of the BOX layer. More precisely, breakage occurs during the thinning of the bulk portion, this effect being equivalent to a mechanical release, whereas just after bonding there is generally no breakage.

By way of example, a chemical removal operation for removing a BOX of 50 nm would be liable to create a hole C of more than 100 nm.

This effect is all the more problematic since the size of these bonding holes may continue to increase as and when they are subjected to the technological steps required to produce the upper level, and may reveal contaminating metal layers, for example layers of Ti/Al/La, etc., in the gate stack and layers of NiPtSi in the silicided zones. Before the formation of the contacts, the source and drain zones are silicided. This process consists in depositing a metal layer on the sources/drains and in heating to create an alloy, typically NiPt+Si=NiPtSi.

Figure 3A:
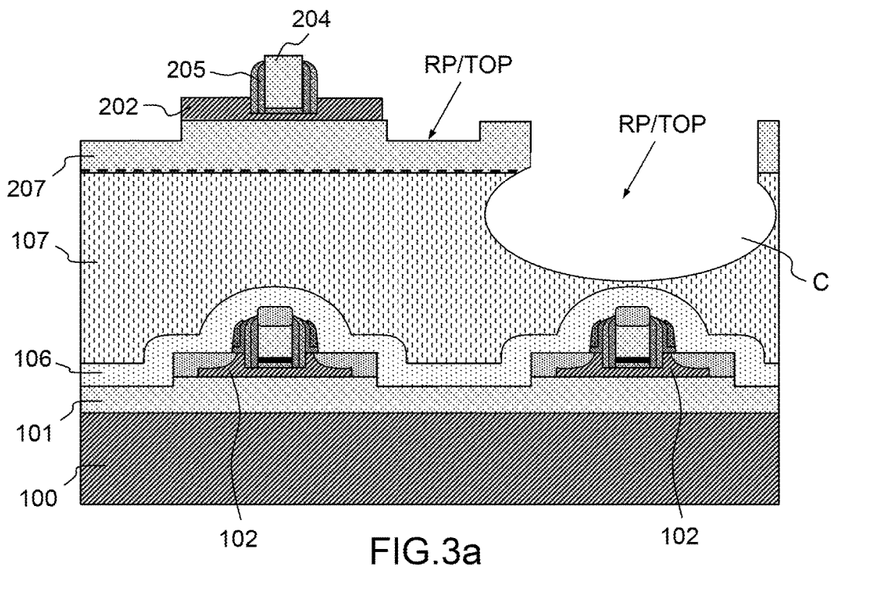
FIGS. 3a and 3b illustrate consumption in a bonding hole during the production of the upper level in the sequential 3-D transistor architecture manufacturing process illustrated by the preceding figures.
Figure 3B:
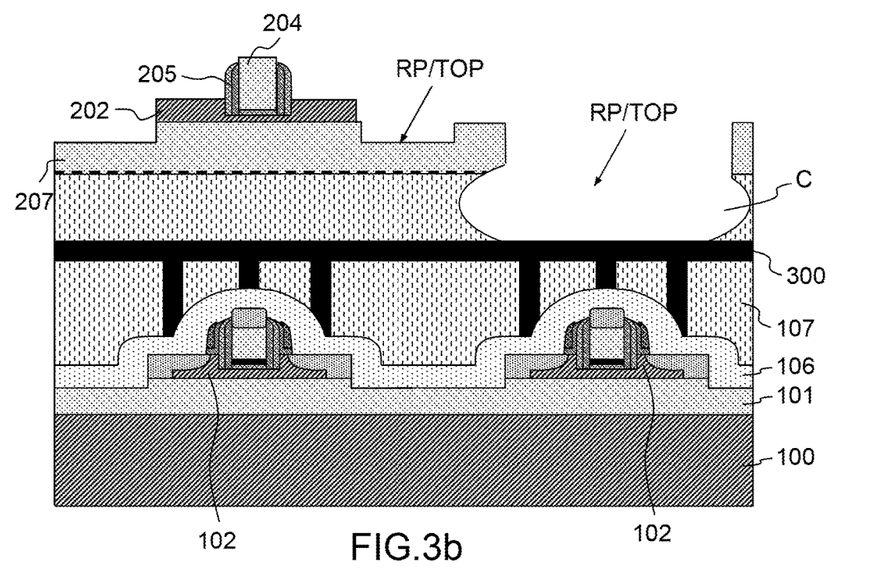

FIG. 3a illustrates this effect, in particular with the step of producing mesas for the transistor of the upper level (which in particular is represented by the second semiconductor layer 202, dielectrics 205 on the flanks and a gate oxide 204) which step is represented by an arrow referenced RP/TOP (for TOP recess process) and also by an arrow referenced RP/TOP level with the hole C. FIG. 3B illustrates the same effect, with the presence of metal line 300 allowing contact to be made to source/gate/drain elements.

Figure 4:
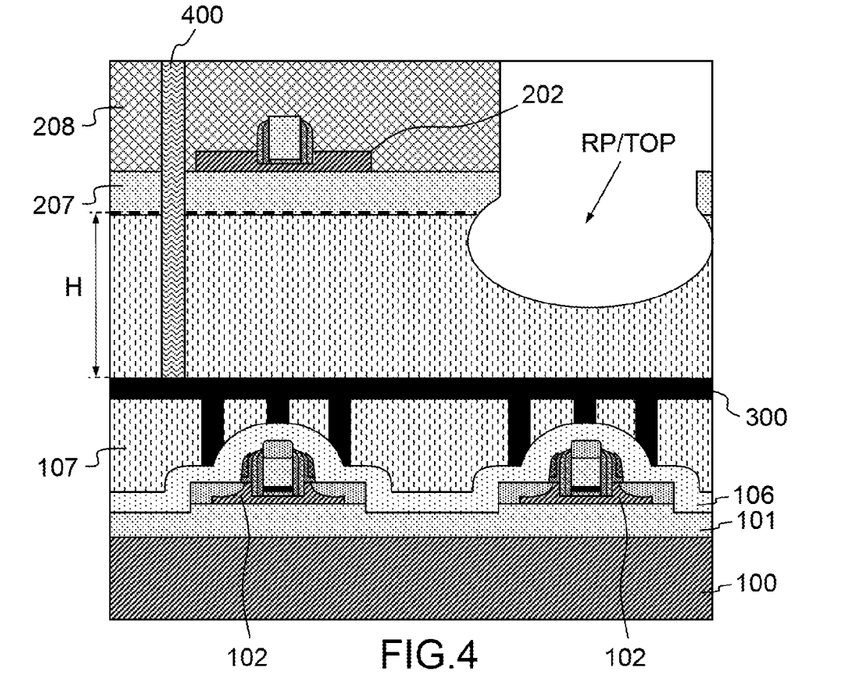
FIG. 4 illustrates an alternative in which the sequential 3-D transistor architecture illustrated in the preceding figures has been re-dimensioned.

A simple solution would be to dimension the lower structure so that it could "take" all the consumption associated with production of the upper level, as illustrated in FIG. 4 showing a large thickness referenced H of first oxide above metal lines 300 in the first oxide layer 107. However, this would be detrimental to the production of 3-D contacts 400, with a critical aspect ratio during the etching of these contacts and an increase in resistance (increased length of the line).

To solve the aforementioned problems and to prevent trapping of particles during the bonding of two stacks of layers from degrading these stacks by generating holes, the present invention proposes to use a process for "plugging" holes including producing plugs by depositing a layer of planarizing material then planarizing this planarizing material layer by selective etching.

Thus the objective that it is sought to achieve in the context of the production of transistor structures is to plug holes up to the level of the active zone formed by the second semiconductor layer 202 of the upper level in the fabricating process described above and in particular illustrated in FIG. 2a or 2b. The planarizing material layer must be planarizable above the upper active zone, while avoiding the use of a planarizing or chemical-mechanical polishing (CMP) technique. Specifically, CMP processes do not allow the planarization of holes larger than about one-hundred microns to be managed and may induce more defects.

SUMMARY OF THE INVENTION

More precisely, the subject of the present invention is a process for fabricating a transistor structure that is produced sequentially, comprising at least one string of the following steps:
  producing at least one first transistor from a first semiconductor layer possibly made of silicon;
  encapsulating at least said first transistor with at least one first dielectric layer defining a first assembly;
  bonding a second dielectric layer located on the surface of a second semiconductor layer possibly made of silicon, to the first dielectric layer;
  depositing a planarizing material layer on the surface of said second semiconductor layer;
  selectively etching said planarizing material layer, to said second semiconductor layer; and
  producing at least one second transistor from said second semiconductor layer.

In the present invention, all of said planarizing material layer may be selectively etched to said second semiconductor layer.

According to variants of the invention, said first dielectric is an oxide.

According to variants of the invention, said second dielectric is an oxide.

According to variants of the invention, the selective etching is carried out by wet etching for example in the presence of acid. Such a type of selective etching is particularly well suited to the etching of hydrogen silsesquioxane (HSQ) or methyl-silsesquioxane (MSQ).

According to variants of the invention, the selective etching is carried out by plasma etching possibly performed in a capacitively or inductively coupled reactor whatever the material being etched. Such a type of selective etching is particularly well suited to the etching of SOC for example.

According to variants of the invention, the second semiconductor layer belongs to an SOI assembly, said process furthermore comprising an operation of thinning said second assembly in order to leave uncovered said second semiconductor layer.

According to variants of the invention, the bonding is achieved via direct (hydrophilic) oxide/oxide bonding without adhesive. The surfaces may be activated by $N_2$ plasma prior to bonding.

According to variants of the invention, the thickness of planarizing material is about a few hundred nanometers, and is possibly comprised between 100 nanometers and 300 nanometers.

According to variants of the invention, the process furthermore comprises producing metal lines in said first dielectric layer, allowing contact to be made to the level of said at least one first transistor.

According to variants of the invention, the process comprises producing a network of 3-D contacts in said structure, for controlling said at least one first transistor and said at least one second transistor.

The chosen planarizing material is:
  preferably resistant to HF, in order to limit consumption;
  depositable at a temperature T<600° C. in order not to degrade the electrical performance of the lower level;
  front-end, in order to permit passage through uncontaminated (ultraclean) equipment (the presence of metals is generally not tolerated in production equipment, at least unless at particular, very low levels);
  resistant to the thermal budget of the production of the upper level (thermal budget typically no higher than 500° C., 2-3 h (cumulative)).

According to variants of the invention, the planarizing material layer is a carbon-based polymer film, a spin-on-carbon polymer. It may be a question of carbon-based materials such as the commercially available materials Silk and FLARE.

According to variants of the invention, the semiconductor being silicon and the planarizing material layer being a carbon film, the selective etching operation is carried out by plasma etching in a capacitively or inductively coupled reactor. The plasma etching operation may be carried out via reducing or oxidizing chemistries in the presence of species such as $O_2$, $SO_2$, $H_2$.

According to variants of the invention, the material of the planarizing material layer is a material based on silicon oxide and is possibly methyl-silsesquioxane or hydrogen silsesquioxane.

In the case of a layer of hydrogen silsesquioxane (HSQ), the selective etching operation is carried out by wet etching in the presence of acid and possibly HF. The planarizing material layer may be densified via an annealing operation at a temperature that is possibly 500° C. or more or via a UV-irradiation operation, or via electron (EBEAM) bombardment or via laser annealing or microwave annealing.

In the case of a layer of methyl-silsesquioxane (MSQ), the selective etching operation is carried out in two stages via a plasma etching operation followed by a wet etching operation.

BRIEF DESCRIPTION OF THE DRAWINGS

The invention will be better understood and other advantages will become apparent on reading the following non-limiting description and by virtue of the appended figures, in which.

DETAILED DESCRIPTION

The present invention is described below in detail, in the case of a 3-D structure produced sequentially and comprising transistors produced from SOI substrates.

Figure 5A:
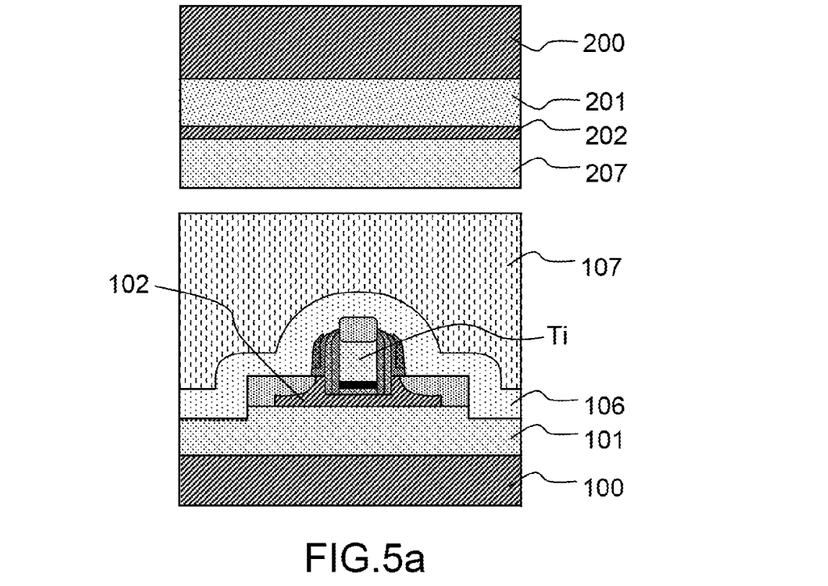
FIGS. 5a to 5e illustrates the main steps of the manufacturing process of an example of a structure of the invention.

First Step:

From a first SOI stack that includes, as is conventional, a bulk silicon substrate 100, a buried BOX oxide layer 101 and a semiconductor layer 102 made of silicon, at least one transistor Ti covered with a dielectric layer 106 is produced, which is encapsulated in a first oxide layer 107 that is deposited chemically.

A second SOI stack, including a bulk silicon substrate 200, a buried oxide layer 201 and a second semiconductor layer 202 made of silicon, covered with a second oxide layer 207, is bonded, as illustrated in FIG. 5a. After planarization of the layer 107, the surfaces 207 and 107 are activated by plasma and then the two surfaces are brought into contact. An anneal is then carried out in order to consolidate the bonding, possibly typically carried out at a temperature lower than 500°, in order to accomplish the bonding operation.

Figure 5B:
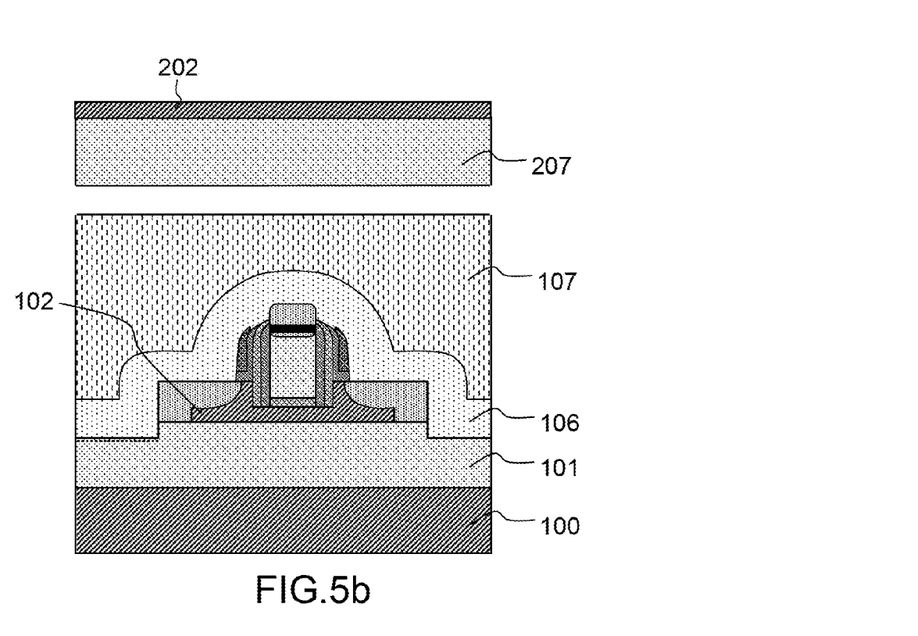

Second Step:

The second SOI stack is thinned by conventional techniques so as to leave the second semiconductor layer 202 made of silicon uncovered, as illustrated in FIG. 5b.

Figure 5C:
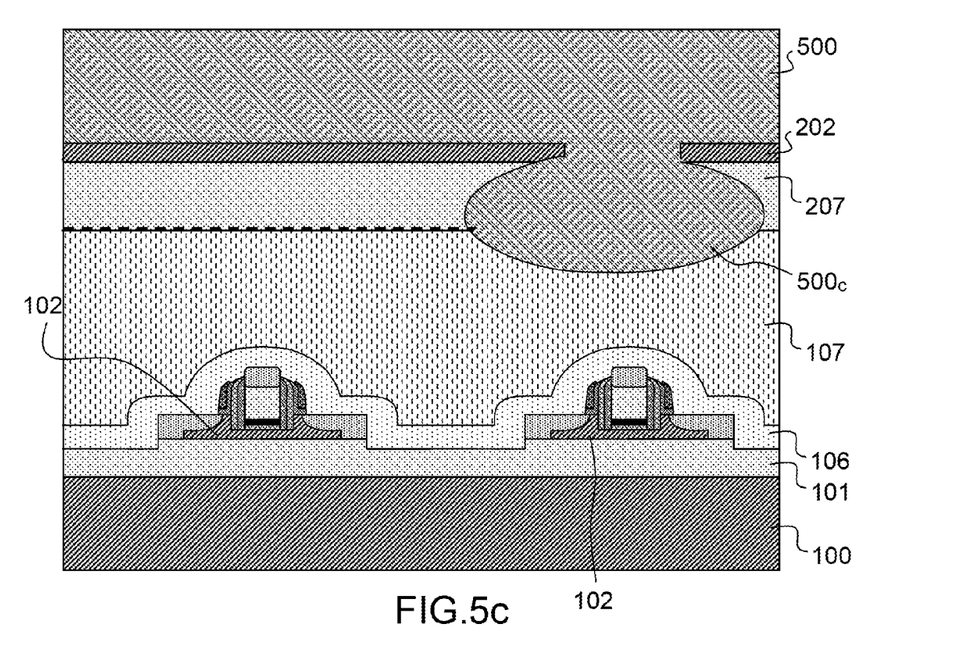

Third Step:

A planarizing material layer 500 is deposited on the surface of the second semiconductor layer 202, also called the active zone because it corresponds to the zone from which transistors may be produced in the upper level, as illustrated in FIG. 5c, which depicts the presence of a plug 500c corresponding to the filling, with the planarizing material layer, of a hole formed beforehand.

This deposit may be formed by depositing a solution by spin coating or by chemical vapor deposition (CVD).

In the case of deposition by spin coating a carbon-based material or HSQ material, the thickness of the planarizing material layer obtained is larger than that of holes liable to form. Typically the thickness of this planarizing material layer may be comprised between 100 nm and 300 nm. This deposit has the advantage of being planarizing and of being uniform over the entire wafer used.

Figure 5D:
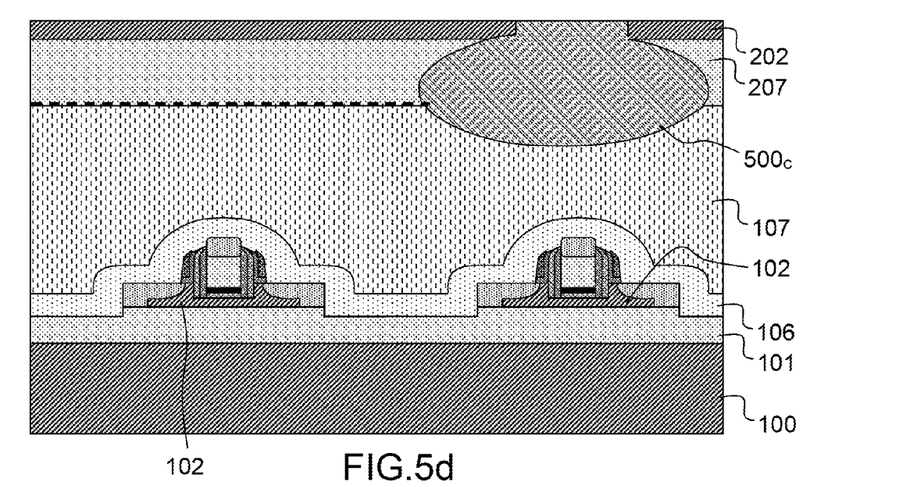

Fourth Step:

This step, illustrated in FIG. 5d, comprises the selective operation of the planarizing material on the surface of the second semiconductor layer 202 made of Si, allowing the planarizing material to be preserved only in the holes.

In the case of a carbon film, the carbon film may be etched by plasma in a capacitively or inductively coupled reactor using a reducing or oxidizing chemistry ($O_2$, $H_2$, $O_2/N_2$, $H_2/N_2$, $SO_2$, etc.). The etching of this carbon film has a high selectivity with respect to the etching of silicon.

For example, to etch 100 nm of thickness of carbon planarizing material layer, the following conditions may be used:

900 W (parameter with respect to the dissociation);

250 V (parameter with respect to the energy of the ions);

a pressure of 10 mTorr with a mass flow rate of $SO_2$: 250 sccm/$O_2$: 30 sccm/$H_2$: 50 sccm at 60° C., expressed in standard centimeters cubed per minute;

an etch rate of the carbon equal to 240 nm/min.

In the case of an HSQ planarizing material: the etching of the material may be carried out by wet etching for example with HF 1%.

The HSQ material may then be densified by annealing (110° C. for 60 seconds then 650° C. for 2 hours, but in any case preferably above 500° C.) in order to increase its resistance to HF. This densification of the HSQ may also be achieved by UV irradiation, by electron (EBEAM) bombardment or by other alternative annealing techniques such as laser annealing or microwave annealing.

In the case of an MSQ planarizing material, the etching of the SiOCH may be carried out in two stages. The SiOCH may first be transformed into $SiO_2$ by modification in a remote, capacitively or inductively coupled oxidizing or reducing (preferably oxidizing because more effective for the modification) plasma. The thickness of modified SiOCH is adjusted beforehand by adjusting plasma parameters such as pressure, power and temperature.

The modified SiOCH is then consumed by wet cleaning (HF) selectively with respect to the non-modified SiOCH.

Figure 5E:
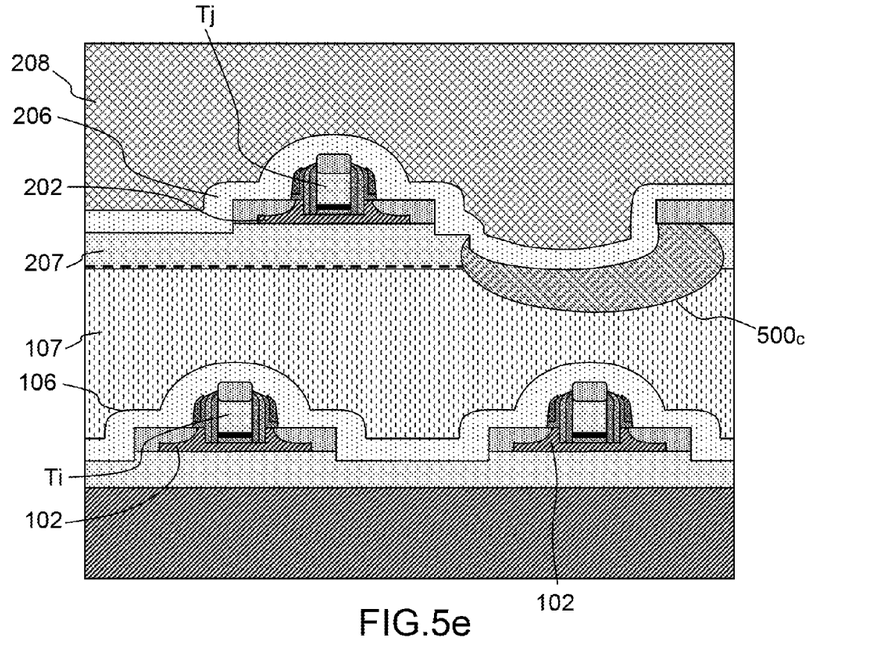

Fifth Step:

It is then possible to produce transistors from the second semiconductor layer as illustrated in FIG. 5e, which shows, schematically, only two levels of transistors: the transistors Ti and the transistors Tj, which are covered by the layers 106 and 206 and by the layers 107 and 207, respectively, since the consequences of the holes generated have been neutralized by plugging said holes with the planarizing material layer, which produces at least one plug 500c. It is possible to reiterate the various operations described above. Thus a process for fabricating a 3-D transistor structure sequentially, safely and level after level is thus obtained, each level including a semiconductor layer from which transistors may be fabricated in ways known to those skilled in the art.

The invention claimed is:

1. A process for fabricating a transistor structure that is produced sequentially, comprising at least one string of the following steps:

producing at least one first transistor from a first semiconductor layer;

encapsulating at least said first transistor with at least one first dielectric layer defining a first assembly;

bonding a second dielectric layer located on a surface of a second semiconductor layer, to the first dielectric layer;

depositing at least partially a planarizing material layer directly on the surface of said second semiconductor layer, wherein the planarizing material layer comprises any of a carbon-based material and a hydrogen silsesquioxane (HSQ) material;

selectively etching said planarizing material layer, to said second semiconductor layer; and producing at least one second transistor from said second semiconductor layer.

2. The fabricating process according to claim 1, wherein said first dielectric is an oxide.

3. The fabricating process according to claim 1, wherein said second dielectric is an oxide.

4. The fabricating process according to claim 1, wherein the selective etching is carried out by wet etching for example in the presence of acid.

5. The fabricating process according to claim 1, wherein the selective etching is carried out by plasma etching possibly performed in a capacitively or inductively coupled reactor.

6. The fabricating process according to claim 1, wherein the second semiconductor layer belongs to an Sa1 assembly, said process furthermore comprising an operation of thinning said second assembly in order to leave uncovered said second semiconductor layer.

7. The fabricating process according to claim 1, wherein the thickness of planarizing material is about a few hundred nanometers, and is possibly comprised between 100 nanometers and 300 nanometers.

8. The fabricating process according to claim 1, furthermore comprising producing metal lines in said first dielectric layer, allowing contact to be made to the level of said at least one first transistor.

9. The fabricating process according to claim 1, comprising producing a network of 3-D contacts in said structure, for controlling said at least one first transistor and said at least one second transistor.

10. The fabricating process according to claim 1, wherein the planarizing material layer is a carbon-based polymer film.

11. The fabricating process according to claim 10, the planarizing material layer being a carbon film, the selective etching operation being carried out by plasma etching in a capacitively or inductively coupled reactor.

12. The fabricating process according to claim 11, wherein the plasma etching operation is carried out via a reducing or oxidizing chemical operation in the presence of species such as $SO_2$, $O_2$, $H_2$.

13. The fabricating process according to claim 1, wherein the material of the planarizing material layer is a material based on silicon oxide and is possibly methyl-silsesquioxane or hydrogen silsesquioxane.

14. The fabricating process according to claim 13, the planarizing material layer being a layer of hydrogen silsesquioxane, and the selective etching operation being carried out by wet etching in the presence of acid and possibly HF.

15. The fabricating process according to claim 14, wherein the planarizing material layer is densified via an annealing operation at a temperature that is possibly 500° C. or more or via a UV-irradiation operation, or via electron bombardment or via laser annealing or microwave annealing.

16. The fabricating process according to claim 13, the planarizing material layer being a layer of methyl-silsesquioxane, and the selective etching operation being carried out in two stages via a plasma etching operation followed by a wet etching operation.

17. The fabricating process according to claim 1, wherein all of said planarizing material layer is selectively etched to said second semiconductor layer.

18. The fabricating process according to claim 1, wherein the first semiconductor layer is made of silicon.

19. The fabricating process according to claim 1, wherein the second semiconductor layer is made of silicon.

* * * * *

UNITED STATES PATENT AND TRADEMARK OFFICE
CERTIFICATE OF CORRECTION

PATENT NO. : 10,490,451 B2  
APPLICATION NO. : 15/625852  
DATED : November 26, 2019  
INVENTOR(S) : Laurent Brunet et al.

Page 1 of 1

It is certified that error appears in the above-identified patent and that said Letters Patent is hereby corrected as shown below:

In the Claims

In Claim 6, Column 7, Line 6, "to an Sa1 assembly" should be -- to an SOI assembly --.

Signed and Sealed this
Twenty-fourth Day of March, 2020

Andrei Iancu
*Director of the United States Patent and Trademark Office*